United States Patent [19]
Anderson et al.

[11] Patent Number: 6,130,910
[45] Date of Patent: Oct. 10, 2000

[54] METHOD AND APPARATUS FOR HIGH EFFICIENCY WIDEBAND POWER AMPLIFICATION

[75] Inventors: Dale Anderson, Ft. Worth, Tex.; Pallab Midya, Schaumburg, Ill.; Ronald Gene Myers, Scottsdale, Ariz.

[73] Assignee: Motorola, Inc., Schaumburg, Ill.

[21] Appl. No.: 08/963,491

[22] Filed: Nov. 3, 1997

[51] Int. Cl.[7] .............................. H03K 7/08; H03K 9/08; H03F 3/38; H03G 3/00

[52] U.S. Cl. ......................... 375/238; 375/297; 455/127; 330/10; 330/127

[58] Field of Search .................................... 375/238, 295, 375/297, 377; 332/109; 455/91, 102, 127; 330/10, 110, 297, 127, 199

[56] References Cited

U.S. PATENT DOCUMENTS

| | | | |
|---|---|---|---|
| 5,249,201 | 9/1993 | Posner et al. | 375/295 |
| 5,251,330 | 10/1993 | Chiba et al. | 455/91 |
| 5,428,642 | 6/1995 | Ponto | 375/297 |
| 5,847,602 | 12/1998 | Su | 330/10 |
| 5,990,751 | 11/1999 | Takita | 330/297 |

OTHER PUBLICATIONS

A publication entitled, "Nonlinear Control and Operation of DC to DC Switching Power Converters", Pallab Midya, published by UMI Dissertion Services, degree date 1995, 146 pages.

An article entitled "High–Efficiency Single–Sideband HF/VHF Transmitter Based Upon Envelope Elimination And Restoration" by F.H. Raab and D.J. Rupp, Green Mountain Radio Research Company, USA from IEEE CP392, UK pp. 21–25, Jul. 4–7, 1994.

An article entitled "Class–S High–Efficiency Amplitude Modulator" by Dr. Frederick H. Raab and D.J. Rupp, Green Mountain Radio Research from GMRR TP93–1:RF Design, vol. 17.No. 5. pp. 70–74, May 1994.

An article entitled "Single–Sideband Transmission By Envelope Elimination and Restoration" by Leonard R. Kahn from Proceedings Of The IRE.

*Primary Examiner*—Stephen Chin
*Assistant Examiner*—Betsy L. Deppe
*Attorney, Agent, or Firm*—Dana B. LeMoine; Timothy J. Lorenz; Frank J. Bogacz

[57] ABSTRACT

A method and apparatus for efficient power amplification of a wideband signal with a correspondingly wide modulation bandwidth includes an envelope detector (220), an interleaved class S modulator (270), and a power amplifier (260). The interleaved class S modulator (270) amplifies includes multiple channels (272) which each include a portion of a class S modulator. Each class S modulator has a duty cycle and time offset associated therewith. The duty cycles of the channels (272) can be the same with the time offsets different, or the duty cycles can also be different. For an interleaved class S modulator with N channels (272), the slew rate increases by as much as N, and the output ripple decreases by as much as $N^2$.

9 Claims, 4 Drawing Sheets

6,130,910

METHOD AND APPARATUS FOR HIGH EFFICIENCY WIDEBAND POWER AMPLIFICATION

FIELD OF THE INVENTION

This invention relates in general to power amplifiers and, in particular, to high efficiency, wideband power amplifiers.

BACKGROUND OF THE INVENTION

Various apparatus are available for amplifying signals. In amplifier applications that involve the amplification and transmission of modulated signals, a premium is placed on amplifier efficiency. In addition, because many applications require a wide bandwidth, a premium is placed on the ability to efficiently create a high fidelity reproduction of a wideband signal.

Communications devices, which often transmit wideband signals, are an example of an application where these qualities are in demand. Low distortion allows the communications devices to communicate more reliably, and high efficiency allows the devices to operate longer on a single battery.

Wideband communications signals usually have correspondingly wide modulation bandwidths. That is, when a signal occupies a large RF bandwidth, the envelope of the signal within that bandwidth is rapidly changing. An amplifier that efficiently amplifies a signal of this type preferably has a wide RF bandwidth and a wide modulation bandwidth.

One method of achieving increased efficiency is to use envelope elimination and restoration (EER)-type amplifiers. EER is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S or other highly efficient power amplifier which operates on the bandwidth of the RF envelope rather than the RF bandwidth. The phase modulated carrier in the phase path is then amplitude modulated by the amplified envelope signal, creating an amplified replica of the input signal.

In EER-type amplifiers the envelope signal occupying the modulation bandwidth is amplified in the amplitude path. Conventional EER-type amplifiers utilize class S modulators to amplify the modulation bandwidth included in the envelope of the input signal. Unfortunately, class S modulators are limited in bandwidth by the switching frequency at which they operate, and as the switching frequency increases, the class S modulator becomes less efficient. This practical constraint sets a maximum modulation bandwidth achievable for any given amplifier efficiency.

Accordingly, a need exists for a power amplifier that efficiently amplifies a wide band RF signal exhibiting a wide modulation bandwidth.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE DRAWINGS

Generally, the present invention helps solve the above-identified problems by providing an amplifier that efficiently amplifies wideband signals with correspondingly wide modulation bandwidths.

Figure 1:
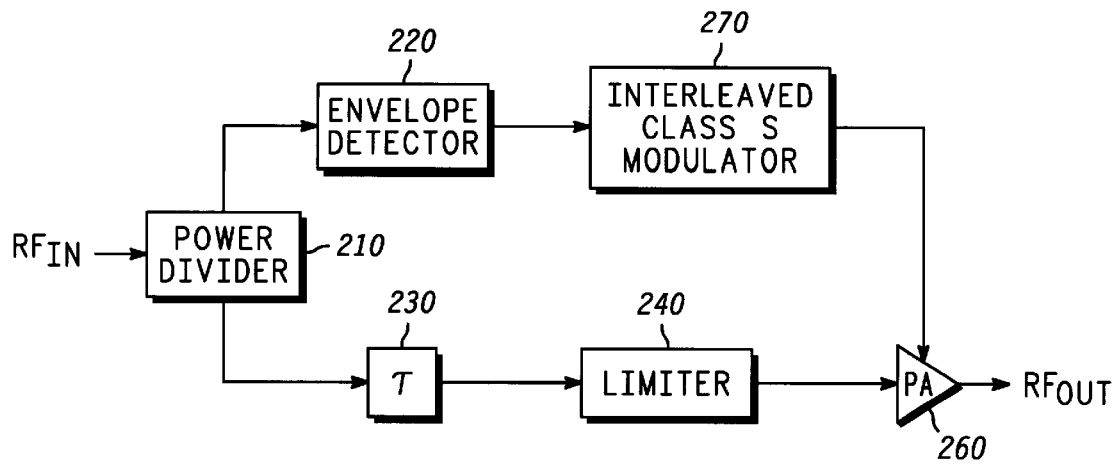
FIG. 1 shows a diagram of an amplifier in accordance with a preferred embodiment of the present invention.

FIG. 1 shows a diagram of an amplifier in accordance with a preferred embodiment of the present invention. EER-type amplifier 10 includes power divider 210, envelope detector 220, interleaved class S modulator 270, time delay element 230, limiter 240, and power amplifier 260. EER-type amplifier 10 receives an RF input into power divider 210. Power divider 210 splits the RF input signal into an amplitude path which feeds envelope detector 220, and a phase path which feeds time delay element 230.

The phase path of EER-type amplifier 10 includes time delay element 230, limiter 240 and power amplifier 260. Time delay element 230, which produces a delay equal to that introduced by interleaved class S modulator 270 in the amplitude path, receives an output from power divider 210. Limiter 240 receives the time delayed signal output from time delay element 230, and amplitude limits the signal. Limiter 240 can be omitted, or it can perform soft limiting, but limiter 240 preferably performs hard limiting so that the output of limiter 240 includes phase information with little or no amplitude information. After limiting, with the amplitude information removed, the resultant signal is the phase modulated carrier. The phase modulated carrier output from limiter 240 is input to power amplifier 260. Power amplifier 260 is any amplifier stage capable of being modulated, and it is preferably a field effect transistor (FET) amplifier. The drain of the FET is conventionally connected to a DC power source; however, as will be discussed below, in a preferred embodiment exemplified herein, the drain of the FET is driven with a signal, resulting in an amplitude modulated output signal.

In a preferred embodiment, time delay element 230 is used in the phase path because it is desirable to recombine the signals from the amplitude path and the phase path after each has been subjected to substantially equal delays. The absolute delay of time delay element 230 is such that the total delay in the phase path is substantially equal to the total delay in the amplitude path. Time delay element 230 is shown as the first element in the phase path; however, the actual placement of time delay element 230 within the phase path is not a limitation of the present invention. Because the function of time delay element 230 is to balance the delays in the phase path and the amplitude path, the actual position of time delay element 230 in the phase path is not important. In an alternate embodiment of the present invention the delay in interleaved class S modulator 270 is minimized by appropriate control such that time delay element 230 becomes unnecessary and is omitted.

Alternate embodiments of the present invention substantially match the delay in the two paths using circuit arrangements other than the one using time delay element 230 alone. In a first alternate embodiment, multiple delay lines, one in each of the phase path and amplitude path are used. In this case, the absolute delay of any one delay line assumes less importance, and the differential delay between the two delay lines is used to match the delays in the two paths. In another alternate embodiment, a differential delay line, such as a surface acoustic wave (SAW) delay line, with one input and multiple outputs is used as a combination of power divider 210 and time delay element 230. In this alternate embodiment, as in the first alternate embodiment, the differential delay is used to match the delay in the two paths.

The amplitude path of EER-type amplifier 10 includes envelope detector 220 and interleaved class S modulator 270. Envelope detector 220 detects the envelope of the RF input signal and outputs an envelope signal which represents the amplitude information included in the original RE input signal. Envelope detector 220 is preferably a diode detector; however, other types of detectors, such as a synchronous detector based upon a double balanced mixer, could be used. Additionally, in an alternate embodiment, the envelope signal is computed from baseband inphase (I) and quadrature (Q) signals.

Interleaved class S modulator 270 amplifies the envelope signal output from envelope detector 220 and drives the drain bias of power amplifier 260. Interleaved class S modulator 270 amplifies the envelope signal to a level commensurate with the desired output. The output of interleaved class S modulator 270 is the power supply for power amplifier 260, and the resultant remodulation of the phase modulated carrier restores the envelope, producing an amplified replica of the input signal.

The EER-type amplifier of FIG. 1 varies the drain bias of power amplifier 260 in such a way as to maintain operation near saturation and therefore in a region of high efficiency. Because the highly efficient power amplifier 260 consumes the majority of the power consumed in EER-type amplifier 10, the entire circuit is considerably more efficient than conventional amplifiers.

Figure 2:
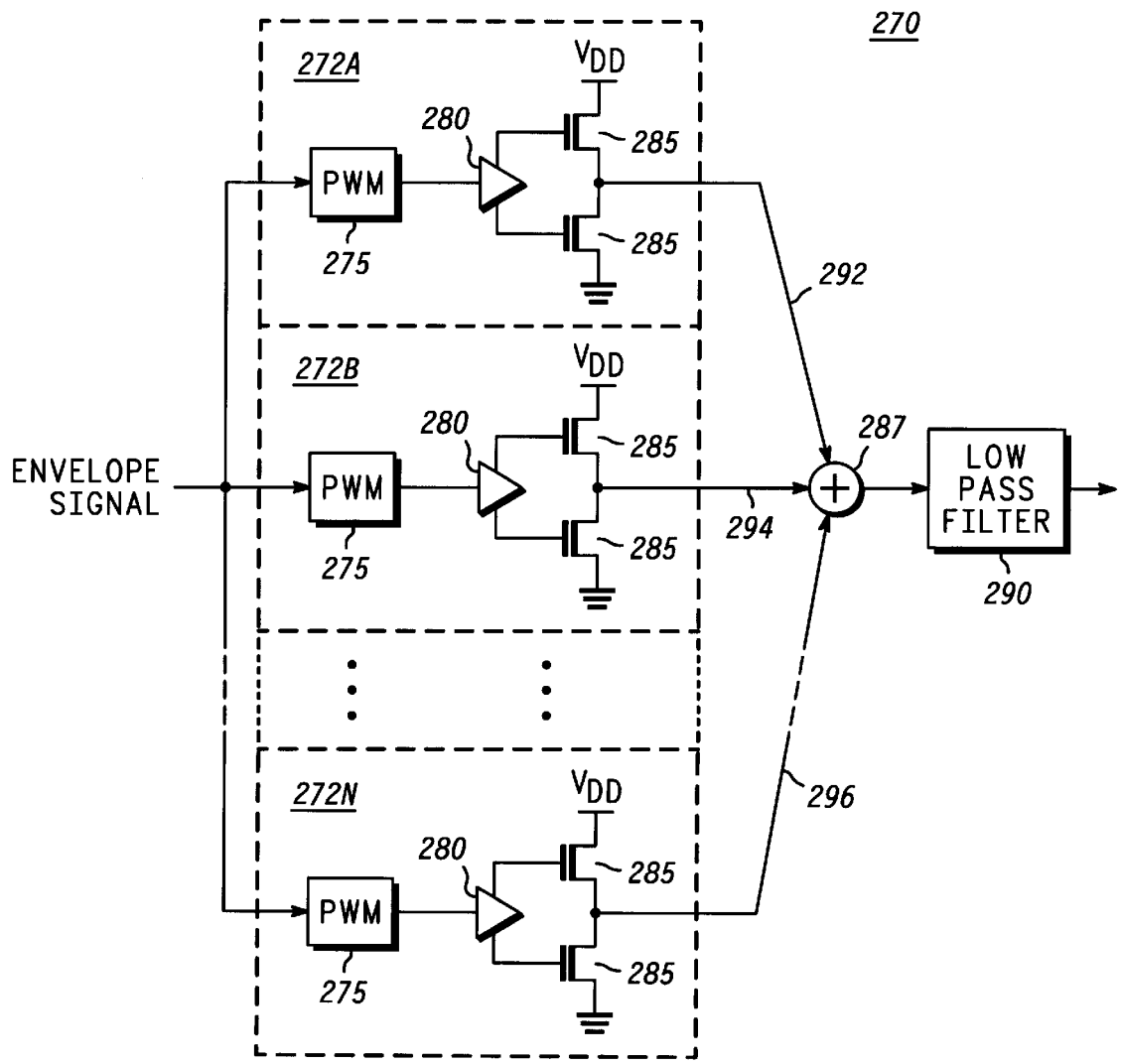
FIG. 2 shows a diagram of an interleaved class S modulator in accordance with a preferred embodiment of the present invention.

FIG. 2 shows a diagram of an interleaved class S modulator in accordance with a preferred embodiment of the present invention. Interleaved class S modulator 270 includes multiple channels 272. Each channel 272 includes pulsewidth modulator 275, driver 280, and switching transistors 285. Interleaved class S modulator 270 further includes combining network 287, and low pass filter 290.

In operation, interleaved class S modulator 270 receives an envelope signal at its input. Pulsewidth modulators 275 produce pulsewidth modulated signals that have duty cycles related to the amplitude of the envelope signal. Drivers 280 receive the pulsewidth modulated signals and drive switching transistors 285. The resulting signals, shown as signals 292, 294, and 296, are power amplified pulsewidth modulated signals with duty cycles that are a function of the envelope signal. Combining network 287 combines the power amplified pulsewidth modulated signals and produces a composite signal. The composite signal is then input into low pass filter 290 which filters out the switching frequencies and passes an amplified version of the envelope signal.

Any number of channels 272 can be implemented within interleaved class S modulator 270. For illustration purposes, FIG. 2 shows three channels 272 with output signals 292, 294, and 296. As will be discussed in more detail below, each pulsewidth modulator 275 has a time offset and duty cycle associated therewith. In a preferred embodiment the duty cycle of each pulsewidth modulator 275 is substantially equal. With substantially equal duty cycles, each pulsewidth modulator 275 has an output proportional to the amplitude of the envelope signal. In this embodiment, each pulsewidth modulator 275 preferably has a different time offset.

In an alternate embodiment, not all pulsewidth modulators 275 have duty cycles which are proportional to the absolute amplitude of the envelope signal. In this embodiment, one pulsewidth modulator 275 has a duty cycle which is proportional to a more significant portion of the envelope signal, while another pulsewidth modulator 275 has a duty cycle proportional to a less significant portion of the envelope signal. For example, the pulsewidth modulator 275 which has a duty cycle proportional to a more significant portion of the envelope signal may not become active until the envelope signal has reached a predetermined amplitude, whereas the pulsewidth modulator 275 which has a duty cycle proportional to a less significant portion of the envelope signal will have a duty cycle which increases as the envelope signal increases from zero, but will drop to back to zero when the predetermined amplitude is crossed.

Interleaved class S modulator 270 as exemplified in FIG. 2 shows a separate combining network 287 and low pass filter 290. In an alternate embodiment, combining network 287 and low pass filter 290 are combined as a single function. In this alternate embodiment, an inductor is placed in each of the signal paths 292, 294, and 296, and the output of each inductor is tied together at a capacitor which is shunt to ground. The simple combined network just described is an illustrative embodiment only, and other circuit configurations are contemplated, including higher order filters.

Figure 3:
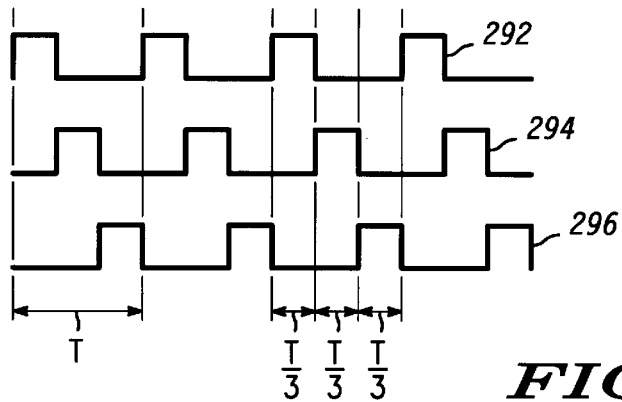
FIG. 3 shows switching waveforms in accordance with a preferred embodiment of the present invention.

FIG. 3 shows switching waveforms in accordance with a preferred embodiment of the present invention. The waveforms shown in FIG. 3 correspond to the amplified pulsewidth modulated signals 292, 294, and 296 as shown in FIG. 2. FIG. 3 shows the signals having an offset T/3 substantially equal to one third of the period T. For illustrative purposes, the duty cycle of all three waveforms is shown as substantially equal to one third. The embodiment that produces these waveforms is termed an "Equal Interleaved" embodiment because the channels are interleaved substantially equally. That is, for 3 channels, the offset is substantially one third of the period, and for N channels, the offset is substantially 1/N of the period.

Figure 4:
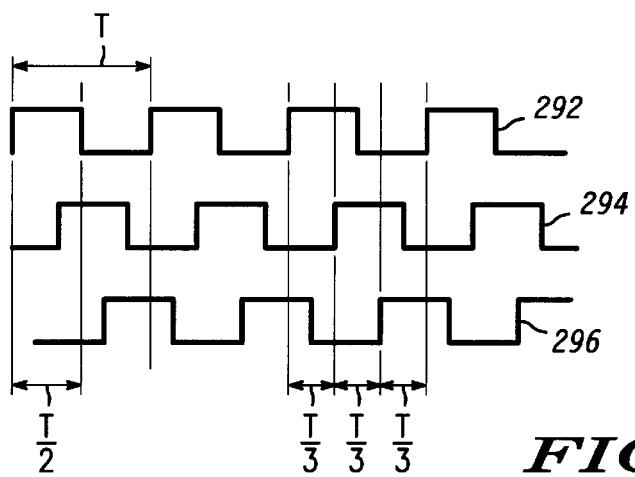
FIG. 4 shows switching waveforms in accordance with a preferred embodiment of the present invention.

FIG. 4 shows switching waveforms in accordance with a preferred embodiment of the present invention. The waveforms of FIG. 4 illustrate the operation of the same embodiment as that of FIG. 3 with a higher level envelope signal. The offsets of the pulsewidth modulators are still shown as substantially one third of the period T, but the duty cycle of each has increased from one third to substantially one half, or T/2. When the signals of FIG. 4 are combined by combining network 287 (FIG. 2) and filtered by low pass filter 290 (FIG. 2), the resulting output from interleaved class S modulator 270 has a greater amplitude than in the case of the switching waveforms of FIG. 3.

The equal interleaved embodiment is advantageous because it is preferably operated such that the output of the interleaved class S modulator has no spectral content at the individual switching frequency. For example, if the switching frequency is Fsw and the number of pulsewidth modulators is N, there is no unwanted spectral content below N times Fs. In addition, the switching noise at the output of the interleaved class S modulator is restricted to N times Fsw and its multiples. This advantageous spectral performance relaxes the performance requirements of low pass filter 290 (FIG. 2) because the signal to be filtered out is at N times Fsw, rather than Fsw. To obtain this performance, the switching transitions are interleaved such that they are substantially equally spaced in time.

Figure 5:
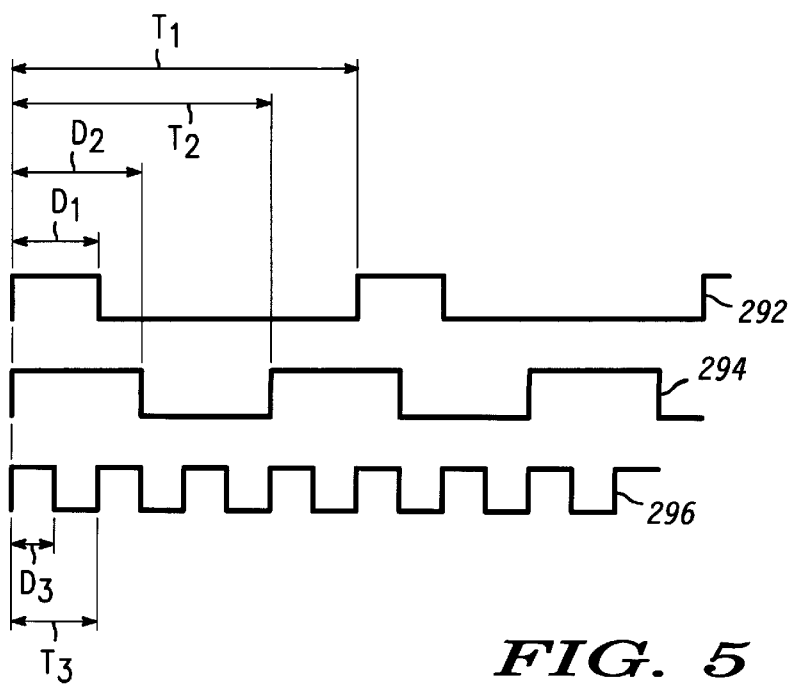
FIG. 5 shows switching waveforms in accordance with an alternate embodiment of the present invention.

FIG. 5 shows switching waveforms in accordance with an alternate embodiment of the present invention. The switching waveforms of FIG. 5 represent the alternate embodiment discussed previously where one pulsewidth modulator 275 (FIG. 2) has a duty cycle proportional to a more significant portion of the envelope signal, and another pulsewidth modulator 275 (FIG. 2) has a duty cycle proportional to a less significant portion of the envelope signal. Signal 292 has a duty cycle D1/T1 proportional to a most significant portion of the envelope signal as input. Signal 294 has a duty cycle D2/T2 proportional to a portion of the envelope signal which is less significant. And finally, signal 296 has a duty cycle D3/T3 proportional to an even less significant portion of the envelope signal. For illustrative purposes, three switching waveforms corresponding to signals 292, 294, and 296 have been shown. As the number of channels 272 (FIG. 2) increase, the number of waveforms as shown in FIGS. 3, 4, and 5 will correspondingly increase. The embodiment that produces these waveforms is termed an "Unequal Interleaved" embodiment because the channels are interleaved substantially unequally.

The unequal interleaved embodiment is advantageous because the modulators operated at different frequencies complement each other in many ways. The lower frequency modulators have slow transient response and higher power conversion efficiency, while the higher frequency modulators have fast transient response and lower power conversion efficiency. The unequal interleaved embodiment of the present invention is preferably operated such that the modulators with the higher efficiency handle most of the power. At the same time, the higher frequency modulators allow the converter to track fast moving waveforms. This provides for the dual advantages of high overall power conversion efficiency and high slew rate.

In a conventional class S modulator the modulator is a single channel switching circuit driving an output filter. In the single channel case, operational bandwidth of the modulator is limited by the pulsewidth modulator maximum switching rate. The method and apparatus of the present invention operates a number of channels in parallel to drive a single output filter. As previously shown and discussed with respect to FIGS. 3–5, switching times are interleaved through the use of time offsets. As the number of channels increases, output slew rate increases and output ripple decreases. Wide bandwidth systems can be realized by this technique. Experimental results have shown that for interleaved class S modulators with N channels, the slew rate can be increased by as much as N, and output ripple is reduced by as much as $N^2$.

This advantageous circuit arrangement which provides high efficiency amplification over a wider bandwidth, provides many advantages. One advantage includes the ability to amplify a larger modulation bandwidth thereby allowing the efficient amplification of larger RF bandwidths in an EER-type amplifier.

Figure 6:
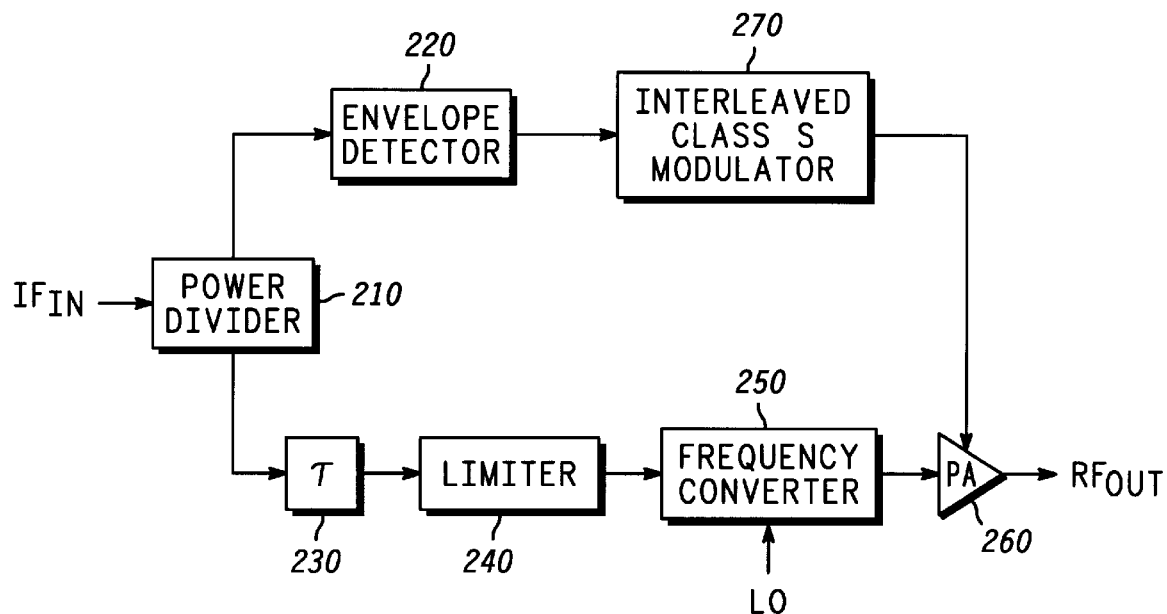
FIG. 6 shows an amplifier in accordance with an alternate embodiment of the present invention.

FIG. 6 shows an amplifier in accordance with an alternate embodiment of the present invention. In FIG. 6 an intermediate frequency (IF) signal is shown as the input signal to EER-type amplifier 20. The IF signal is input into power divider 210. Power divider 210 functions to split the input signal into the amplitude path and the phase path. The amplitude path feeds envelope detector 220, and the phase path feeds time delay element 230.

The amplitude path of EER-type amplifier 20 includes envelope detector 220 and interleaved class S modulator 270. These elements correspond to the elements of FIG. 1 which have like names and like reference numbers. In addition, interleaved class S modulator 270 corresponds to interleaved class S modulator 270 of FIG. 1, which was discussed in detail previously in connection with FIG. 2.

The phase path of EER-type amplifier 20 includes time delay element 230, limiter 240, frequency converter 250 and power amplifier 260. Time delay element 230, limiter 240 and power amplifier 260 correspond to the elements shown in FIG. 1 with like names and like reference numbers. In contrast to the embodiment shown in FIG. 1, the alternate embodiment of FIG. 6 includes frequency converter 250 in the phase path. Frequency converter 250 receives the signal in the phase path and also receives a local oscillator (LO) signal. Frequency converter 250 converts the frequency of the carrier signal to its final RF frequency using circuitry well known in the art, such as a mixer. The resulting signal is then used to drive power amplifier 260 which operates at the final RF frequency.

Because of the operation of frequency converter 250, the amplifier of FIG. 6 takes in a signal at a frequency different from the final RF frequency. FIG. 6 shows an IF signal input to EER-type amplifier 20. The IF input signal can be above or below the resultant RF frequency. In addition, one skilled in the art will understand that a baseband signal could also be used. Therefore, in the alternate embodiment exemplified in FIG. 6, the input signal can be at any frequency different from the RF frequency.

In this circuit arrangement, with frequency converter 250 being an integral part of the amplifier, the amplifier becomes more tightly integrated with the device that houses the amplifier. Tighter integration results in smaller, lower power devices, which are easier to manufacture.

Figure 7:
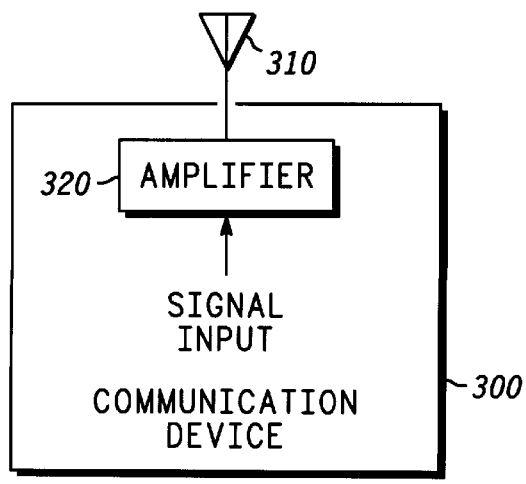
FIG. 7 shows a diagram of a communications device in accordance with a preferred embodiment of the present invention.

FIG. 7 shows a diagram of a communications device in accordance with a preferred embodiment of the present invention. Communications device 300 includes amplifier 320 and antenna 310. Amplifier 320 may comprise any of the amplifiers of the present invention, including for example, EER-type amplifier 10 (FIG. 1), interleaved class S modulator 270 (FIG. 2), or EER-type amplifier 20 (FIG. 6). Communications device 300 may be one of many different devices capable of communications. Examples include, but are not limited to, subscriber units in a communications system, radio receivers, transmitters, and transceivers, one-way and two-way pagers, cellular phones, other radiotelephones, and basestations.

Figure 8:
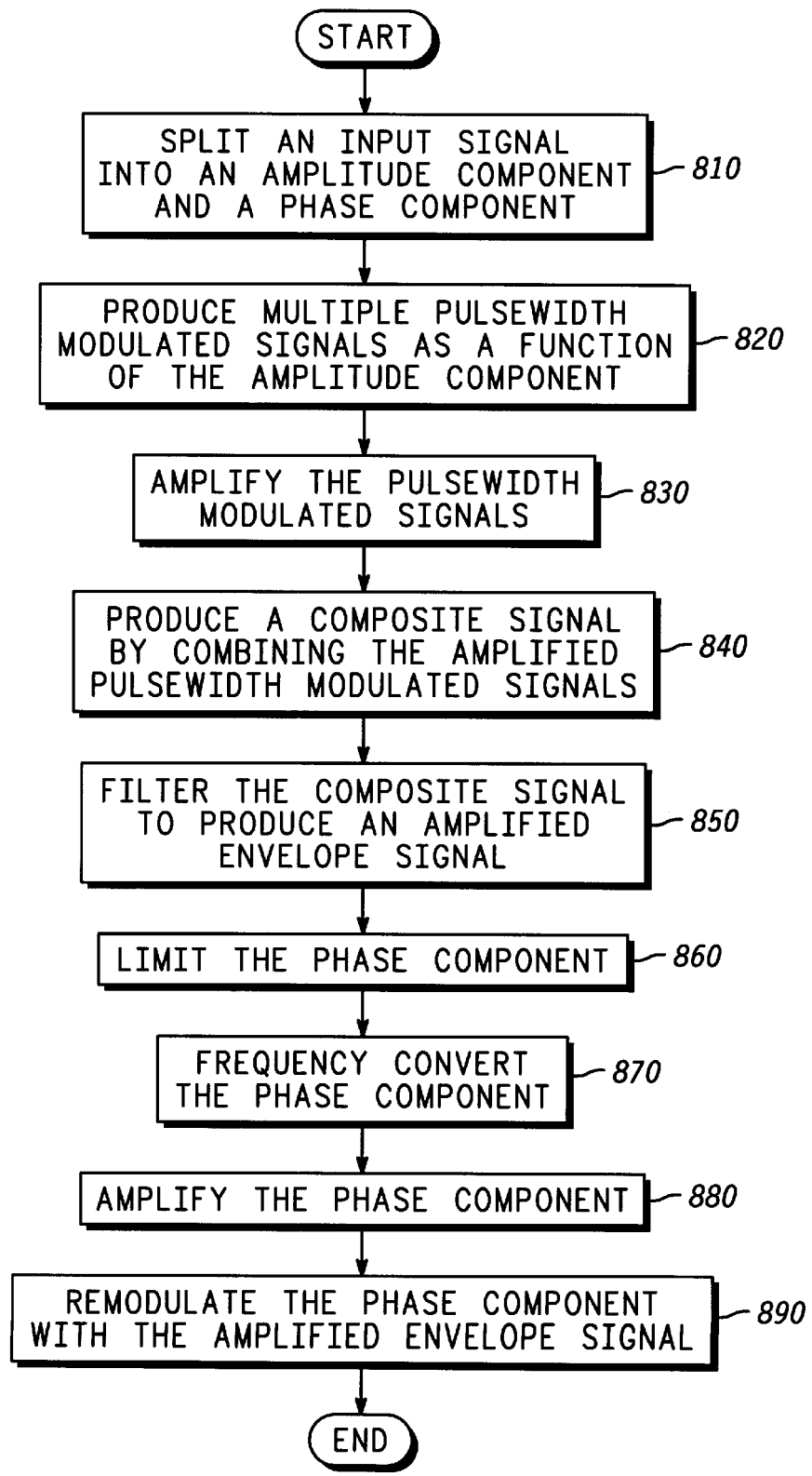
FIG. 8 shows a flowchart for a method of amplifying a signal in accordance with a preferred embodiment of the present invention.

FIG. 8 shows a flowchart for a method of amplifying a signal in accordance with a preferred embodiment of the resent invention. Method 800 begins with step 810 where an input signal is split into an amplitude component and a phase component. Then in step 820 multiple pulsewidth modulated signals are produced as a function of the amplitude component. Each of the multiple pulsewidth modulated signals has a duty cycle and a time offset associated with it. The time offsets can be equal or different, and the duty cycles can also be equal or different. In a preferred embodiment, step 820 produces multiple pulsewidth modulated signals with substantially equal duty cycles, but with time offsets that are not equal. In an alternate embodiment, step 820 produces multiple pulsewidth modulated signals with duty cycles that are not equal. In this alternate embodiment, one pulsewidth modulated signal has a duty cycle proportional to a more significant portion of the input signal, while another pulsewidth modulated signal has a duty cycle proportional to a less significant portion of the input signal.

After the multiple pulsewidth modulated signals have been produced as a result of step 820, each of the pulsewidth modulated signals is amplified in step 830. A composite signal is then produced in step 840 by combining the amplified pulsewidth modulated signals. The composite signal produced as a result of step 840 includes frequency components that reflect the frequency of the input signal, and also includes frequency components that reflect the switching frequencies of the pulsewidth modulators. In step 850 the composite signal is filtered to remove the frequency components that reflect the switching frequencies of the pulsewidth modulators, thereby producing an amplified version of the envelope signal.

In step 860 the input signal is amplitude limited to produce a phase modulated carrier. The phase modulated carrier is preferably an amplitude limited signal including the phase information from the original input signal. Then in step 870 the phase modulated carrier is converted to a desired frequency for transmission. One skilled in the art will understand that step 870 is only necessary if the input signal is of a different frequency than the desired RF output signal.

In step 880 the phase modulated carrier is amplified with a power amplifier. Finally, in step 890, the signals in the amplitude path and the phase path are brought back together when the power amplifier is modulated with the amplified envelope signal. This modulation can be performed in a number of ways, but in a preferred embodiment, it is performed by modulating the drain bias of a field effect transistor (FET) amplifier. In this way, the amplified envelope signal functions as the power supply of the final RF amplifier. The result is a high fidelity RF output signal which is an amplified and optionally frequency converted version of the input signal.

It is desirable to recombine the amplitude of the signal with the phase of the signal after each has undergone a similar delay. Depending on the circuit elements used in amplifying the envelope signal and in amplifying the phase modulated carrier, a time delay may be necessary in one or more signal paths in order to time align the recombination of the amplitude and phase.

In summary, the method and apparatus of the present invention as described is a versatile way of achieving efficient amplification of a signal with a large RF bandwidth and a correspondingly large modulation bandwidth. Embodiments of an EER-type amplifier which utilizes an interleaved class S modulator have been described. The interleaved class S modulator efficiently amplifies a wideband envelope and allows the EER-type amplifier to efficiently amplify a wideband RF signal having a correspondingly wideband modulation bandwidth.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments. For example, power amplifier 260 could be comprised of multiple stages.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of amplifying an input signal, said method comprising:

splitting said input signal into an envelope component and a phase component;

generating an envelope signal representing amplitude information of said envelope component;

creating a plurality of pulsewidth modulated signals in response to said envelope signal;

combining said plurality of pulsewidth modulated signals to produce an amplified envelope signal; and receiving said phase component as an input to an amplifier stage and said amplified envelope signal as a power supply to said amplifier stage such that said phase component is remodulated and amplitude of said input signal is restored to reproduce a substantial replica of said input signal.

2. The method of claim 1 wherein creating a plurality of pulsewidth modulated signals comprises:

creating a first pulsewidth modulated signal having a first duty cycle; and creating a second pulsewidth modulated signal having a second duty cycle.

3. The method of claim 2 wherein said first duty cycle is proportional to a more significant portion of said input signal and said second duty cycle is proportional to a less significant portion of said input signal.

4. The method of claim 1 wherein creating a plurality of pulsewidth modulated signals comprises:

creating a first pulsewidth modulated signal having a first time offset; and creating a second pulsewidth modulated signal having a second time offset.

5. The method of claim 4 wherein said first time offset and said second time offset are not equal.

6. An amplifier comprising:

a divider configured to split an input signal into an amplitude path signal and a phase path signal;

an detector configured to detect an envelope of said amplitude path signal and generate an envelope signal representing amplitude information;

a modulator configured to receive said envelope signal and produce an amplified envelope signal, said modulator comprising:

a plurality of pulsewidth modulators configured to receive said envelope signal, each of said plurality of pulsewidth modulators configured to produce a pulsewidth modulated signal having a duty cycle substantially related to an amplitude of said envelope signal;

a combining network configured to combine each pulsewidth modulated signal of said plurality of pulsewidth modulators to produce a composite signal; and a filter configured to filter said composite signal and produce said amplified envelope signal;

a delay element configured to delay said phase path signal in order to compensate for a delay of said amplitude path signal to produce a time delayed signal; and a power amplifier configured to receive said amplified envelope signal as a power supply such that said time delayed signal is remodulated and said envelope of said amplitude path signal is restored to reproduce a substantial replica of said input signal.

7. The amplifier of claim 6 wherein said plurality of pulsewidth modulators is comprised of:
a first pulsewidth modulator having a first duty cycle and a first time offset; and
a second pulsewidth modulator having a second duty cycle and a second time offset.

8. The amplifier of claim 7 wherein said first duty cycle is proportional to a more significant portion of an input signal, and said second duty cycle is proportional to a less significant portion of said input signal.

9. The amplifier of claim 7, wherein said first time offset and said second time offset are not equal.

* * * * *